(12) United States Patent
Schuler

(10) Patent No.: US 10,699,860 B2
(45) Date of Patent: Jun. 30, 2020

(54) OPTICAL ROCKER SWITCH

(71) Applicant: Valeo Japan Co., Ltd., Saitama (JP)

(72) Inventor: Stephane Schuler, Shenzhen (CN)

(*) Notice: Subject to any disclaimer, the term of this patent is extended or adjusted under 35 U.S.C. 154(b) by 0 days.

(21) Appl. No.: 16/205,190

(22) Filed: Nov. 29, 2018

(65) Prior Publication Data

US 2019/0164707 A1    May 30, 2019

(30) Foreign Application Priority Data

Nov. 30, 2017    (JP) .................. 2017-231022

(51) Int. Cl.

| | | |
|---|---|---|
| G02B 6/35 | (2006.01) | |
| H01H 23/16 | (2006.01) | |
| H01H 23/02 | (2006.01) | |
| H01H 23/30 | (2006.01) | |
| H03K 17/969 | (2006.01) | |
| H03K 17/968 | (2006.01) | |
| H01H 21/22 | (2006.01) | |

(52) U.S. Cl.
CPC ........... H01H 23/025 (2013.01); G02B 6/353 (2013.01); H01H 23/168 (2013.01); H01H 23/30 (2013.01); H03K 17/968 (2013.01); H03K 17/969 (2013.01); H01H 2021/225 (2013.01); H01H 2219/062 (2013.01); H01H 2239/022 (2013.01)

(58) Field of Classification Search
CPC ........ G02B 6/35; G02B 6/354; G02B 6/3564; H01H 2219/054; H01H 2219/062; H01H 23/168; H01H 2239/022
See application file for complete search history.

(56) References Cited

U.S. PATENT DOCUMENTS

| | | | |
|---|---|---|---|
| 4,376,566 A | | 3/1983 | Blackington |
| 5,721,794 A | * | 2/1998 | Uchiyama .............. G02B 6/353 385/16 |

FOREIGN PATENT DOCUMENTS

| | | |
|---|---|---|
| CN | 107017870 A | 8/2017 |
| DE | 4309049 A1 | 9/1994 |

(Continued)

OTHER PUBLICATIONS

English abstract for JP-2014120322.

(Continued)

*Primary Examiner* — Vanessa Girardi
(74) *Attorney, Agent, or Firm* — Fishman Stewart PLLC

(57) ABSTRACT

Problem
To be capable of specifying an operation of a knob.
Solution
A switch 1 includes an operation detecting portion 7 which detects an operation of the knob 5. The operation detecting portion 7 includes a movable member 6 which displaces in association with the operation of the knob 5, a through hole 62a which penetrates through a light shielding portion 62 of the movable member 6 in a thickness direction thereof, one optical source 15 which is provided on one side of the movable member 6 in the thickness direction, a light guiding path 9A which is provided on the other side of the movable member 6 in the thickness direction, and two light receiving elements 10A, 10A which are attached to the light guiding path 9A. The light guiding path 9A is arranged in a position of being capable of receiving light emitted from the optical source 15 through the through hole 62a when the movable member 6 is arranged in a predetermined position by the operation of the knob 5.

20 Claims, 8 Drawing Sheets

(56) References Cited

FOREIGN PATENT DOCUMENTS

| | | |
|---|---|---|
| DE | 4332748 A1 | 3/1995 |
| EP | 2562782 A1 | 2/2013 |
| EP | 2730894 A1 | 5/2014 |
| EP | 2743953 A1 | 6/2014 |
| JP | 2014120322 A | 6/2014 |

OTHER PUBLICATIONS

English abstract for DE-4309049.
English abstract for CN-107017870.
English abstract of EP-0645280, corresponding to DE-4332748.
European search report dated Mar. 25, 2019.

* cited by examiner

<Neutral>

<Push>

<Pull>

<Push>

<Push>

<Pull>

OPTICAL ROCKER SWITCH

CROSS-REFERENCE TO RELATED APPLICATIONS

This application claims priority to Japanese Application No. JP 2017-231022, filed on Nov. 30, 2017, the contents of which are hereby incorporated by reference in its entirety.

TECHNICAL FIELD

The present invention relates to a switch.

BACKGROUND

Patent document 1 discloses a switch which is configured to rotate a knob around a rotational shaft to turn on a switching element.

Patent Document 1: Japanese Patent Laid-Open No. 2014-120322 A

FIG. 8A to FIG. 8C are drawings explaining a switch 100 according to a conventional example.

FIG. 8A is an exploded perspective view illustrating the switch 100.

FIG. 8B and FIG. 8C are cross sectional views explaining an operation of the switch 100.

As illustrated in FIG. 8A to FIG. 8C, the switch 100 disclosed in Patent Document 1 is provided with a knob 102 which is operated by a user. The knob 102 is supported by a case 101 provided in the switch 100 to be capable of swinging around a rotational shaft X1.

The case 101 is attached to a polar board 110 having a printed circuit board 109, and in this attached state, the knob 102 supported by the case 101 is arranged to face the printed circuit board 109 in a direction of attaching the case 101 to the polar board 110.

On the printed circuit board 109, a pair of switching elements 107, 108 are provided to be spaced from each other in a direction of the rotational shaft X1.

In the case 101, a pair of cams 105, 106 corresponding to the switching elements 107, 108 on a one-to-one basis are supported to be capable of swinging around a rotational shaft X2 in parallel with the rotational shaft X1.

The knob 102 is provided with a pair of operable elements 103, 104 on a facing portion to the printed circuit board 109, and engaging portions 103a, 104a provided in tips of the operable elements 103, 104 are engaged to engaging grooves 105a, 106a of the cams 105, 106 corresponding to the engaging portions 103a, 104a respectively.

In the switch 100, when an operable portion 102a in the tip side of the knob 102 is operated in a circumferential direction around the rotational shaft X1, the cams 105, 106 are operated by the operable elements 103, 104 to rotate around the rotational shaft X2.

For example, when the operable portion 102a of the knob 102 is operated in a pulling-up direction (refer to a sign A in FIG. 8C), the one switching element 108 switches on by the cam 106. In addition, when the operable portion 102a of the knob 102 is operated in a pushing-down direction (refer to a sign B in FIG. 8B), the other switching element 107 switches on by the cam 105.

Accordingly the switch 100 is configured such that the operating direction of the knob 102 is specified based upon which of the switching elements 107, 108 are switched on.

As described above, the switch 100 according to Patent Document 1 requires the switching element for detecting the operation of the knob 102.

Here, the switch element is provided with a two-line circuit for detecting an on/off operation of the switch from a point of view of a fail-safe. Therefore the switching element is relatively expensive, and the switch provided with this switching element is higher in cost percent of the switching element in manufacturing costs.

Therefore it is required to be able to specify the operation of the knob with a lower priced configuration.

The present invention is made in view of the aforementioned problems, and has an object of providing a switch that can specify an operation of a knob at lower cost.

SUMMARY

The present invention provides a switch comprising:
a movable member which displaces in association with an operation of a knob;
a through hole which penetrates through the movable member in a thickness direction of the movable member;
one light emitting element which is provided on one side of the movable member in the thickness direction;
a light guiding path which is provided on the other side of the movable member in the thickness direction; and
at least one receiving element which are attached to the light guiding path, wherein
the light guiding path is arranged in a position of being capable of receiving light emitted from the light emitting element through the through hole when the movable member is arranged in a predetermined position by the operation of the knob.

According to the present invention, when the movable member is arranged in the predetermined position by the operation of the knob, the light emitted from the light emitting element enters the light guiding path through the through hole, and the light that has entered the light guiding path is received by the light receiving element attached to the light guiding path.

Accordingly it is possible to detect that the movable member is arranged in the predetermined position by the operation of the knob through the reception of the light by the light receiving element.

Since a combination of the light emitting element, the light guiding path and the light receiving element can be provided at lower cost than the switch element, it is possible to specify the operation of the knob with a lower priced configuration.

DETAILED DESCRIPTION

Hereinafter, an explanation will be made of an embodiment of the present invention by taking a case of a switch 1 which is used for switching an on/off operation of a parking brake as an example.

Figure 1:
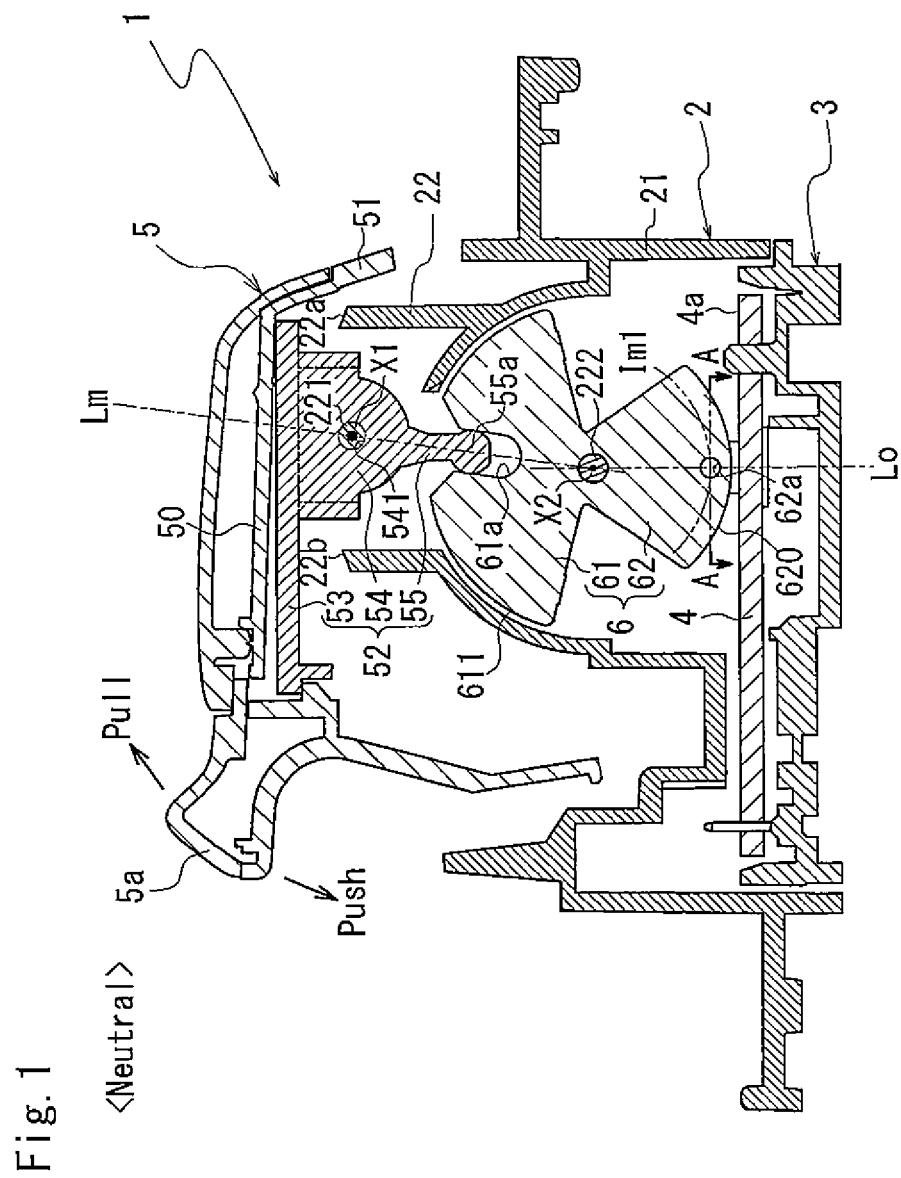
FIG. 1 is a cross sectional view illustrating a switch according to an embodiment of the present invention.

FIG. 1 is a cross sectional view illustrating the switch 1 by cutting the switch 1 along a movable member 6.

Figure 2:
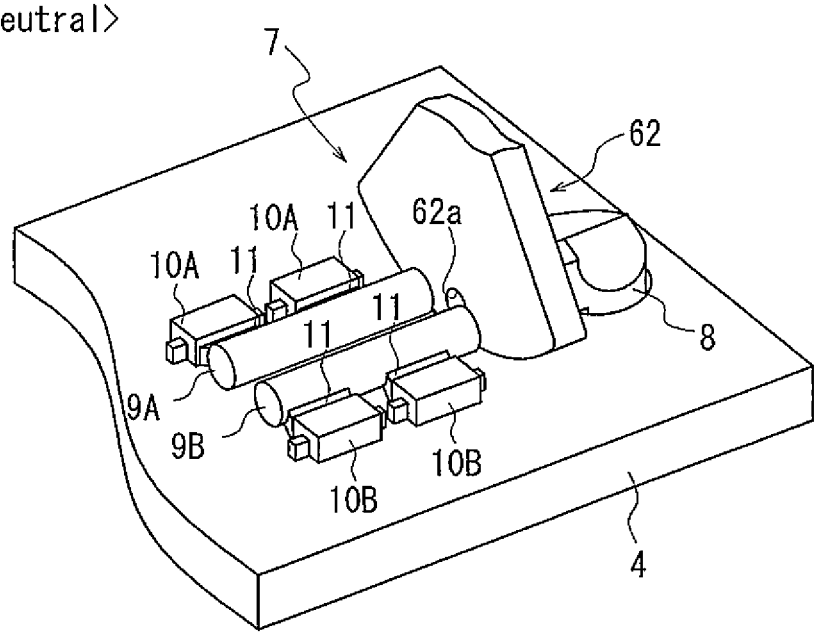
FIG. 2 is an enlarged perspective view illustrating an operation detecting portion provided in the switch.

FIG. 2 is an enlarged perspective view illustrating the periphery of an operation detecting portion 7 provided in the switch 1.

Figure 3A:
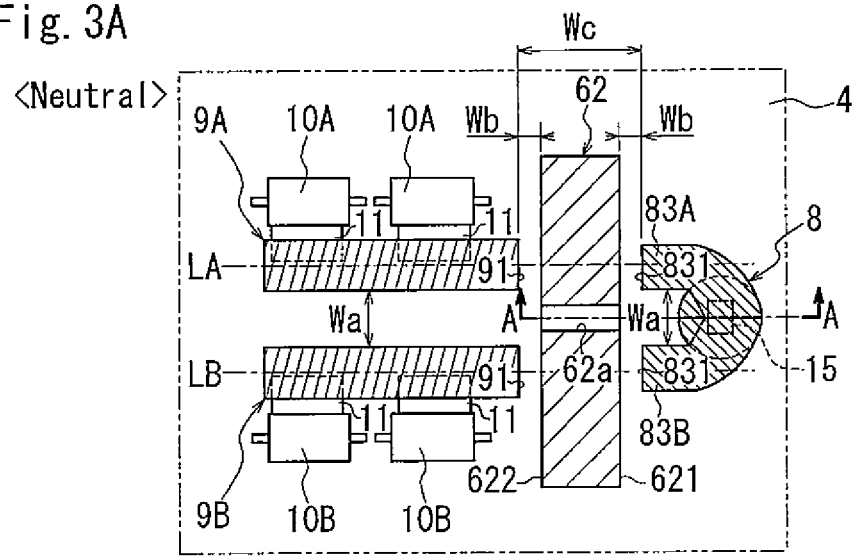
FIGS. 3A and 3B are cross sectional views illustrating the operation detecting portion provided in the switch.
Figure 3B:
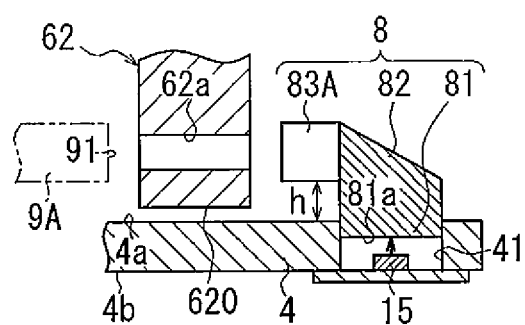

FIG. 3A and FIG. 3B are cross sectional views schematically illustrating the periphery of the operation detecting portion 7 provided in the switch 1. FIG. 3A is a drawing illustrating the operation detecting portion 7 as viewed from a knob 5-side, and a cross sectional view explaining an arrangement of respective components (light guiding body 8, light shielding portion 62, through hole 62a, light guiding paths 9A, 9B, light receiving elements 10A, 10B and optical source 15) in the operation detecting portion 7 when the knob 5 is in a neutral position. It should be noted that FIG. 3A shows a cross-sectional surface by cutting the light guiding body 8, the light shielding portion 62 and the light guiding paths 9A, 9B along line A-A in FIG. 1.

Figure 3C:
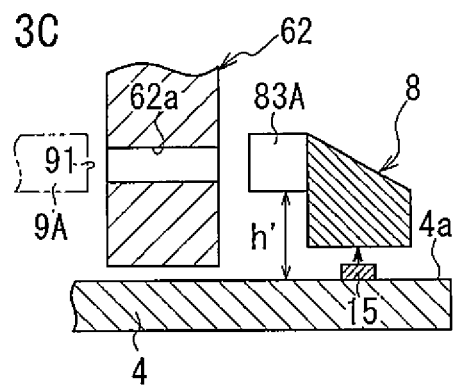
FIGS. 3C and 3D are cross sectional views illustrating an operation detecting portion according to a modification.
Figure 3D:
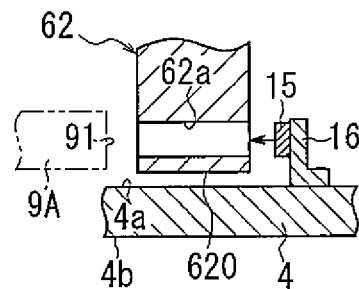

FIG. 3B is an A-A cross-sectional view in FIG. 3A. FIG. 3C and FIG. 3D are cross sectional views explaining an operation detecting portion 7 according to a modification.

As illustrated in FIG. 1, the switch 1 includes the knob 5 which is operated by a user, a case 2 which supports the knob 5 to be capable of swinging, a polar board 3 to which the case 2 is attached and a printed circuit board 4 which is disposed on a facing surface of the polar board 3 to the case 2.

Here, in the following explanation, the knob 5-side is described as "upward" and the polar board 3-side is described as "downward" in FIG. 1 for explanatory purposes.

As illustrated in FIG. 1, the case 2 includes a peripheral wall portion 21 which is fitted on an outer periphery of the polar board 3 and a support wall 22 which supports the knob 5 to be rotatable.

The support wall 22 projects upward closer to the knob 5-side than the peripheral wall portion 21, and upper ends 22a, 22b of the support wall 22 are inserted in the inside of a peripheral wall portion 51 provided in the knob 5.

The knob 5 includes an operable member 52 with an operable element 55.

The operable member 52 further includes an attaching plate 53 with a plate-shape, supported portion 54 extending downward from the attaching plate 53, and the operable element 55 disposed on a lower end of the supported portion 54.

The attaching plate 53, the supported portion 54 and the operable element 55 are formed integrally.

The attaching plate 53 of the operable member 52 is attached on a lower surface of a plate-shaped base portion 50 provided in the knob 5. One plate-shaped, supported portion 54 is disposed on the attaching plate 53. The supported portion 54 has a through hole 541 formed therein, and a support shaft 221 disposed in the support wall 22 of the case 2 penetrates through the through hole 541.

The knob 5 is supported by the case 2 through the support shaft 221. In this state, the knob 5 is capable of swinging around a rotational shaft X1 along a central axis of the support shaft 221.

The operable element 55 extends in a radial direction of the rotational shaft X1 from the supported portion 54, and has an engaging portion 55a in a tip side that is directed downward in the printed circuit board 4-side.

The engaging portion 55a of the operable element 55 is engaged to an engaging groove 61a of a movable member 6.

The movable member 6 is positioned between the knob 5 and the printed circuit board 4, and the movable member 6 is rotatably supported by a support shaft 222 in the case 2-side. In this state, the movable member 6 is capable of swinging around a rotational shaft X2 in parallel with the rotational shaft X1 of the knob 5.

The movable member 6 includes an operated portion 61 provided with the engaging groove 61a and the light shielding portion 62 provided with the through hole 62a.

The operated portion 61 is formed in a fan shape as viewed in a direction of the rotational shaft X2, and has an outer periphery 611 which is formed in an arc shape as viewed in the direction of the rotational shaft X2 and is directed upward in the knob 5-side.

The engaging groove 61a in the operated portion 61 extends in a radial direction of the rotational shaft X2. The engaging groove 61a linearly extends in a range from the arc-shaped outer periphery 611 of the operated portion 61 to the vicinity of the rotational shaft X2 along a straight line Lm passing the rotational shaft X2 of the movable member 6.

The light shielding portion 62 extends downward in the polar board 3-side from the center of the operated portion 61 in the width direction. The light shielding portion 62 is formed in a horn shape in which a peripheral width around the rotational shaft X2 is the wider as it is away from the operated portion 61.

An outer periphery 620 of the light shielding portion 62 in the tip side is formed in an arc shape along the circumferential direction around the rotational shaft X2. The outer periphery 620 of the light shielding portion 62 is disposed with a clearance to the printed circuit board 4. Therefore the light shielding portion 62 is prevented from sliding on an upper surface 4a of the printed circuit board 4 at the time the movable member 6 rotates around the rotational shaft X2.

In a state where the knob 5 is arranged in a neutral position (refer to FIG. 1), the light shielding portion 62 of the movable member 6 is arranged in a direction along a straight line Lo.

In this state, the straight line Lo passes a substantially central part of the light shielding portion 62 in the width direction as viewed in the direction of the rotational shaft X2 and is perpendicular to the printed circuit board 4. The straight line Lo further intersects at a predetermined angle with a straight line Lm which along the engaging groove 61a of the movable member 6 in a state where the knob 5 is arranged in the neutral position (refer to FIG. 1).

The light shielding portion 62 is provided with the through hole 62a in a position which is away inside from the outer periphery 620 in the printed circuit board 4-side and intersects with the straight line Lo.

The through hole 62a is provided to penetrate the light shielding portion 62 in the thickness direction (direction of the rotational shaft X2).

In the present embodiment, at least the light shielding portion 62 in the movable member 6 is processed to prevent light from transmitting therein.

Here, methods of preventing the transmission of light are exemplified as follows. (a) To form the light shielding portion 62 itself with a material in non-light transmission properties. (b) To coat a surface of the light shielding portion 62 with a material in non-light transmission properties.

Therefore in the light shielding portion 62, only a section of the through hole 62a is a region of enabling the transmission of light.

It should be noted that a plastic material in light transmission properties may be filled in the through hole 62a for preventing penetration of foreign objects which block the transmission of light.

As illustrated in FIG. 2 and FIGS. 3A to 3D, in the printed circuit board 4, the light guiding body 8 is disposed on one side across the light shielding portion 62 of the movable member 6 and the light guiding paths 9A, 9B are disposed on the other side.

As illustrated in FIG. 3A and FIG. 3B, the light guiding body 8 is provided to change a moving direction of the light emitted from the optical source 15 and disperse the emitted light into two lights.

The light guiding body 8 includes an incident portion 81, a spectral portion 82 and exit portions 83A, 83B.

The light guiding body 8 is formed as a one-piece composed of the incident portion 81, the spectral portion 82 and the exit portions 83A, 83B.

The light guiding body 8 is formed of a material and in a shape, which makes it possible to reflect light that is input from the incident portion 81 in the inside and guide the light to the exit portions 83A, 83B.

As illustrated in FIG. 3B, the printed circuit board 4 is provided therein with an accommodation hole 41 to accommodate and arrange the optical source 15. The accommodation hole 41 is provided to penetrate through the printed circuit board 4 in the thickness direction.

The optical source 15 is inserted in the accommodation hole 41 from a lower surface 4b of the printed circuit board 4 on the polar board 3-side. The optical source 15 is disposed to face an incident surface 81a of the incident portion 81 in the inside of the accommodation hole 41.

The incident surface 81a is a flat surface facing an exit surface of the optical source 15, and the incident surface 81a is in parallel with an upper surface 4a of the printed circuit board 4.

The optical source 15 is connected electrically to the lower surface 4b-side of the printed circuit board 4. The light emitted from the optical source 15 is incident to the incident portion 81 from the incident surface 81a.

In the present embodiment, an LED (Light emitting diode) is adopted as the optical source 15, but any component may be adopted as the optical source 15 as long as it can emit light which can be received by receiving element 10A.

The light guiding body 8 is provided to insert the incident portion 81 having an outer shape matching the accommodation hole 41 in the accommodation hole 41 from the upper surface 4a of the printed circuit board 4.

The spectral portion 82 reflects the light incident to the incident portion 81 to be distributed into the exit portion 83A-side and the exit portion 83B-side.

The spectral portion 82 is provided to be neighbored to an upper side of the incident portion 81, and the spectral portion 82 projects upward from the upper surface 4a of the printed circuit board 4.

As illustrated in FIG. 3A, the exit portions 83A, 83B are disposed in the light shielding portion 62-side (left side in the figure) of the spectral portion 82 as viewed from the knob 5-side.

The exit portions 83A, 83B are formed in a columnar shape and are provided in parallel with each other to have an interval Wa therebetween in a displacement direction (upper-lower direction in FIG. 3A) of the light shielding portion 62.

Exit surfaces 831, 831 of the exit portions 83A, 83B respectively face a side surface 621 of the light shielding portion 62.

The exit surfaces 831, 831 are flat surfaces along the displacement direction of the light shielding portion 62, and respectively face the side surface 621 with the same interval Wb to the one side surface 621 of the light shielding portion 62.

The pair of light guiding paths 9A, 9B are provided at the opposite side (left side in FIG. 3A) to the exit portions 83A, 83B as viewed from the light shielding portion 62.

The light guiding paths 9A, 9B are formed in a columnar shape with a material in light transmission properties.

Incident surfaces 91, 91 of the light emitted from the exit surfaces 831, 831 of the light guiding body 8 are provided on one ends of the light guiding paths 9A, 9B in the longitudinal direction.

The incident surfaces 91, 91 are flat surfaces along the displacement direction of the light shielding portion 62, and respectively face the side surface 622 with the same interval Wb to the other side surface 622 of the light shielding portion 62.

The light guiding paths 9A, 9B are provided in parallel with each other to have an interval Wa therebetween in a displacement direction (upper-lower direction in FIG. 3A) of the light shielding portion 62.

The incident surfaces 91, 91 of the light guiding paths 9A, 9B face the exit surfaces 831, 831 of the light guiding body 8 to have an interval Wc therebetween. This interval Wc is set to an interval which can prevent the incident surfaces 91, 91 and the exit surfaces 831, 83 from interfering with the light shielding portion 62 provided in the movable member 6 when the movable member 6 swings around the rotational shaft X2.

As described above, the light shielding portion 62 of the movable member 6 is provided with the through hole 62a which enables the transmission of light. A position of the through hole 62a is set on a basis of a state where the knob 5 is arranged in a neutral position.

Specifically in a state where the knob 5 is arranged in the neutral position, the through hole 62a is set to be arranged in a substantially intermediate position between the exit portions 83A, 83B in the displacement direction of the light shielding portion 62.

Therefore in a state where the knob 5 is arranged in the neutral position, the light emitted from the exit surfaces 831, 831 of the light guiding body 8 is blocked by the light shielding portion 62. Thus, the light emitted from the exit surfaces 831, 831 cannot be reach the incident surfaces 91, 91 of the light guiding paths 9A, 9B.

The light guiding path 9A is provided with the pair of light receiving elements 10A, 10A with an interval therebetween in the longitudinal direction of the light guiding path 9A.

The light receiving elements 10A, 10A are communicated with the light guiding path 9A through support members 11 having light transmission properties. The pair of light receiving elements 10A, 10A are configured to be capable of receiving the light incident to the light guiding path 9A through the support members 11.

Also in the light guiding path 9B, the pair of light receiving elements 10B, 10B are provided with an interval therebetween in the longitudinal direction of the light guiding path 9B.

The light receiving elements 10B, 10B as well are communicated with the light guiding path 9B through the support members 11 having light transmission properties. The pair of light receiving elements 10B, 10B are configured to be capable of receiving the light incident to the light guiding path 9B through the support members 11.

Light receiving element 10A, 10A, 10B, 10B is connected to light receiving detecting circuit (unillustrated) provided on the printed circuit board 4.

An explanation will be made by taking a case of light receiving element 10A, 10A as an example, the light receiving detecting circuit outputs light receiving signals in the case of one light receiving element 10A has received the light, and in the case of the other light receiving element 10A has received the light, respectively.

In the present embodiment, in a control device to which output signals from the light receiving detecting circuit are input, it is judged that knob 5 has operated in the case when the control device receives the light receiving signal from one light receiving element 10A and the light receiving signal from the other light receiving element 10A within a predetermined time (for example, 20 msec).

Figure 4A:
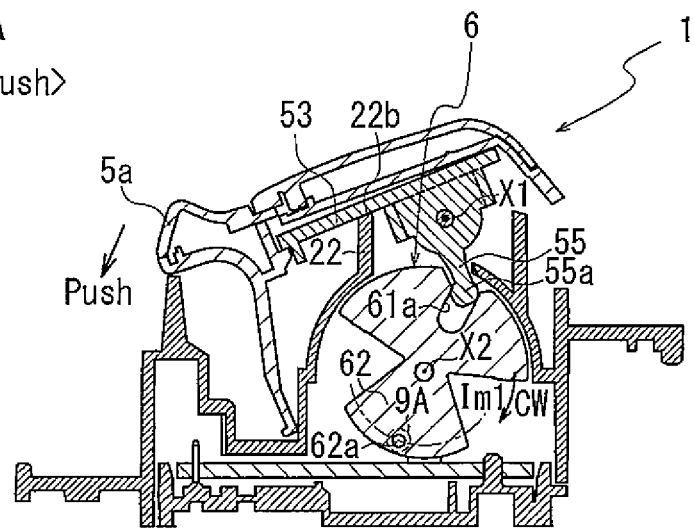
FIGS. 4A and 4B are drawings explaining an operation of a knob in the switch.
Figure 4B:
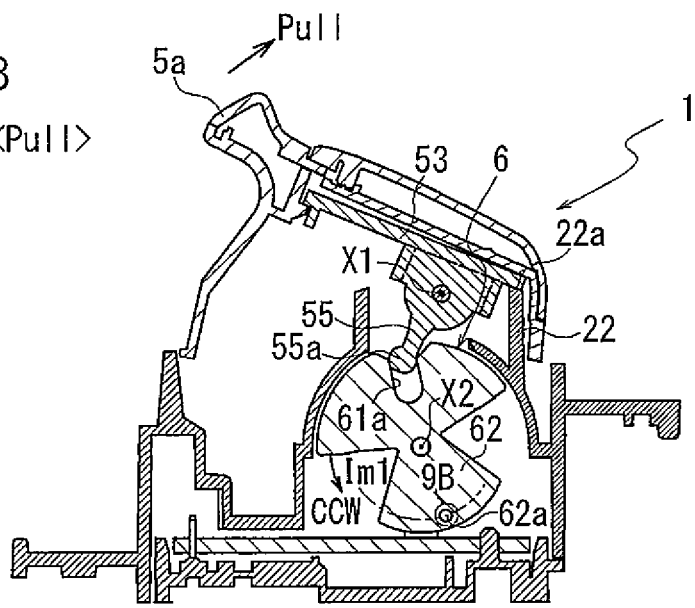

FIG. 4A and FIG. 4B are drawings explaining a displacement of the movable member 6 which moves in association with an operation of the knob 5. FIG. 4A is a drawing explaining a case where an operable portion 5a of the knob 5 is pushed down (a case where the knob 5 is operated to a push side). FIG. 4B is a drawing explaining a case where the operable portion 5a of the knob 5 is pulled up (a case where the knob 5 is operated to a pull side).

Figure 5A:
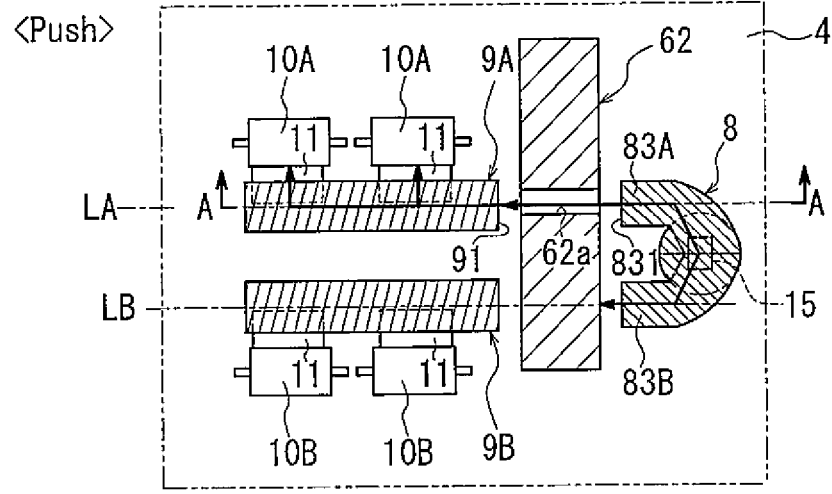
FIGS. 5A to 5C are drawings explaining an operation of the operation detecting portion in association with the operation of the knob.
Figure 5B:
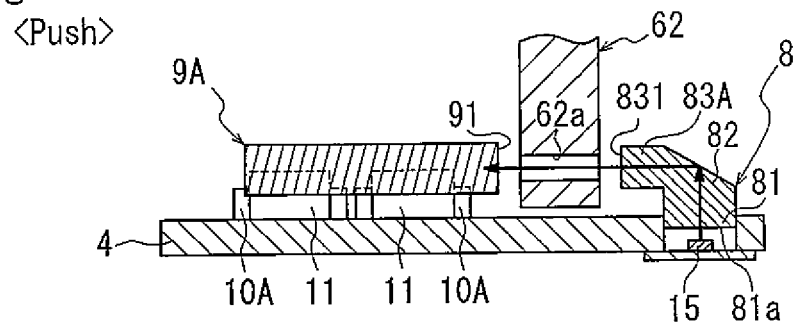
Figure 5C:
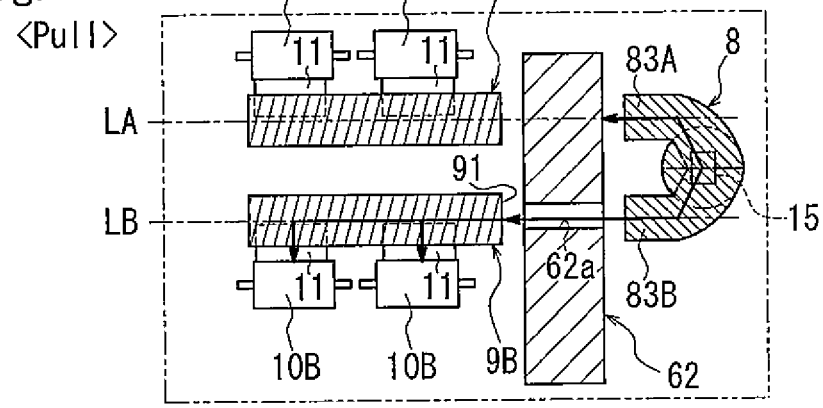

FIG. 5A to FIG. 5C are drawings explaining an operation of the operation detecting portion 7 that moves in association with an operation of the knob 5. FIG. 5A is a drawing explaining an arrangement of the light shielding portion 62 in a case where the knob 5 is operated to a push side and a moving path of light emitted from the optical source 15. FIG. 5B is an A-A cross-sectional view in FIG. 5A. FIG. 5C is a drawing explaining an arrangement of the light shielding portion 62 in a case where the knob 5 is operated to the pull side and a moving path of light emitted from the optical source 15.

In a state where an operating force by a user does not act on the knob 5 of the switch 1, the knob 5 is arranged in the neutral position illustrated in FIG. 1 by an urging force of an unillustrated spring.

In a state where the knob 5 is arranged in the neutral position, the movable member 6 positions the through hole 62a of the light shielding portion 62 on the straight line Lo (refer to FIG. 1).

In a state where the through hole 62a is positioned on the straight line Lo, as illustrated in FIG. 3A, the through hole 62a is positioned between a center axis line LA of the light guiding path 9A and a center axis line LB of the light guiding path 9B.

Therefore the light which enters the light guiding body 8 from the optical source 15 and is then outputted from the exit portions 83A, 83B is blocked from being incident to the light guiding paths 9A, 9B by the light shielding portion 62.

Therefore a light receiving signal is not outputted from any of the light receiving elements 10A, 10A, 10B, 10B.

As illustrated in FIG. 4A, when the knob 5 is operated to the push side, the movable member 6 is pushed by the engaging portion 55a of the operable element 55 engaged to the engaging groove 61a. Thereby, the movable member 6 swings in a clockwise direction CW around the rotational shaft X2.

Then, the light shielding portion 62 provided with the through hole 62a displaces in the clockwise direction CW in the circumferential direction around the rotational shaft X2. Accordingly the through hole 62a provided in the light shielding portion 62 displaces in the left direction in FIG. 4A along a virtual circle Im1 surrounding the rotational shaft X2 by a predetermined interval.

The displacement of the through hole 62a along the virtual circle Im1 is a displacement of the light shielding portion 62 and the through hole 62a to the upper side in the figure in a case of FIG. 3A.

Here, the displacement of the knob 5 to the push side terminates in a point (point of reaching a first predetermined position) where the attaching plate 53 (refer to FIG. 1) of the knob 5 abuts on an upper end 22b (stopper) of the support wall 22.

In the switch 1, when the attaching plate 53 abuts on the upper end 22b, the through hole 62a is arranged in a position of overlapping the center axis line LA at between the exit portion 83A and the light guiding path 9A (refer to FIG. 5A and FIG. 5B).

In this state, the exit portion 83A, the through hole 62a and the light guiding path 9A are arranged on the common center axis line LA. Therefore the light outputted from the exit portion 83A from among lights which are outputted from the optical source 15 and enter the light guiding body 8 enters the light guiding path 9A through the through hole 62a.

In addition, the light incident to the light guiding path 9A is received respectively in the light receiving elements 10A, 10A attached to the light guiding path 9A, and light receiving signals are outputted from the light receiving elements 10A, 10A.

Further, in a state of FIG. 5A, the light shielding portion 62 is positioned between the exit portion 83B and the light guiding path 9B. As described before, the light shielding portion 62 is processed to block the transmission of light.

Therefore the light outputted from the exit portion 83B from among lights which are outputted from the optical source 15 and enter the light guiding body 8 is blocked by the light shielding portion 62 and cannot enter the light guiding path 9B.

Therefore light receiving signals are not outputted from the light receiving elements 10B, 10B attached to the light guiding path 9B. Accordingly in a control device (unillustrated) to which output signals of the switch 1 are input, it is possible to detect the operation of the knob 5 to the push side when input of light receiving signals from the light receiving elements 10A, 10A only.

As illustrated in FIG. 4B, when the knob 5 is operated in the pull side, the movable member 6 is pushed by the engaging portion 55a of the operable element 55 engaged to the engaging groove 61a. Thereby, the movable member 6 swings in a counterclockwise direction CCW around the rotational shaft X2.

Then, the light shielding portion 62 provided with the through hole 62a displaces in the counterclockwise direction CCW in the circumferential direction around the rotational shaft X2. Accordingly the through hole 62a provided in the light shielding portion 62 displaces in the right direction in FIG. 4B along the virtual circle Im1 surrounding the rotational shaft X2 by a predetermined interval.

The displacement of the through hole 62a along the virtual circle Im1 is a displacement of the light shielding portion 62 and the through hole 62a to the lower side in a case of FIG. 3A Here, the displacement of the knob 5 to the pull side terminates in a point (point of reaching a second predetermined position) where the attaching plate 53 (refer to FIG. 1) of the knob 5 abuts on the upper end 22b (stopper) of the support wall 22.

In the switch 1, when the attaching plate 53 abuts on the upper end 22a, the through hole 62a is arranged in a position of overlapping the center axis line LB at between the exit portion 83B and the light guiding path 9B (refer to FIG. 5C).

In this state, the exit portion 83B, the through hole 62a and the light guiding path 9B are arranged on the common center axis line LB. Therefore the light outputted from the exit portion 83B from among lights which are outputted from the optical source 15 and enter the light guiding body 8 enters the light guiding path 9B through the through hole 62a.

In addition, the light incident to the light guiding path 9B is received respectively in the light receiving elements 10B, 10B attached to the light guiding path 9B, and light receiving signals are outputted from the light receiving elements 10B, 10B.

Further, in a state of FIG. 5C, the light shielding portion 62 is positioned between the exit portion 83A and the light guiding path 9A. As described before, the light shielding portion 62 is processed to block the transmission of light.

Therefore the light outputted from the exit portion 83A from among lights which are outputted from the optical source 15 and enter the light guiding body 8 is blocked by the light shielding portion 62 and cannot enter the light guiding path 9A.

Therefore light receiving signals are not outputted from the light receiving elements 10A, 10A attached to the light guiding path 9B. Accordingly in the control device (unillustrated) to which output signals of the switch 1 are input, it is possible to detect the operation of the knob 5 to the pull side when input of light receiving signals from the light receiving elements 10B, 10B only.

Here, the light receiving elements 10A, 10B attached to the light guiding paths 9A, 9B output light receiving signals at the time of when receiving the light.

Figure 8A:
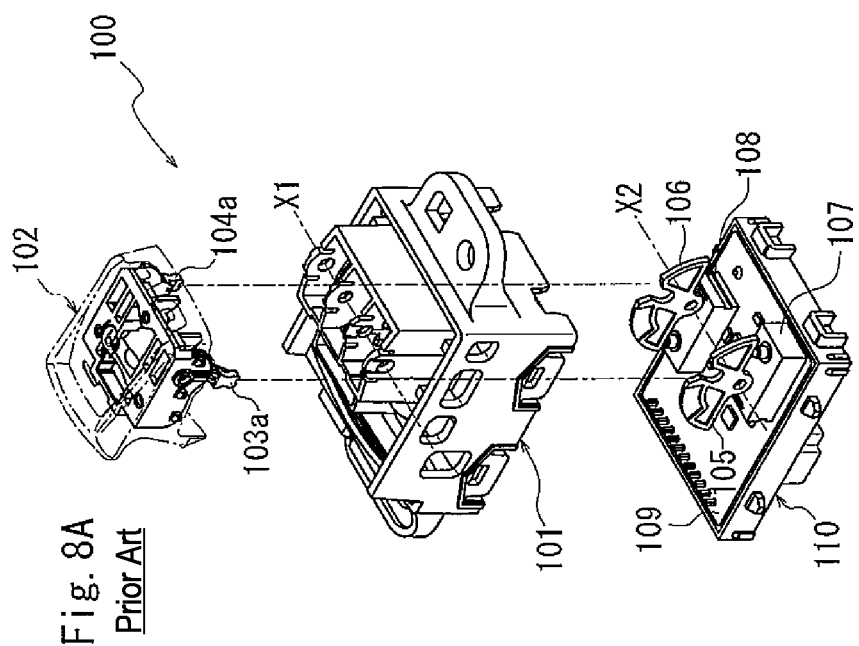
FIGS. 8A to 8C are drawings explaining a switch according to a conventional example.
Figure 8B:
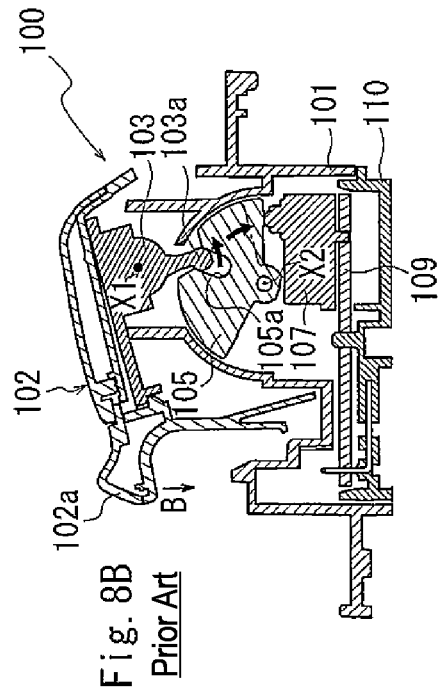
Figure 8C:
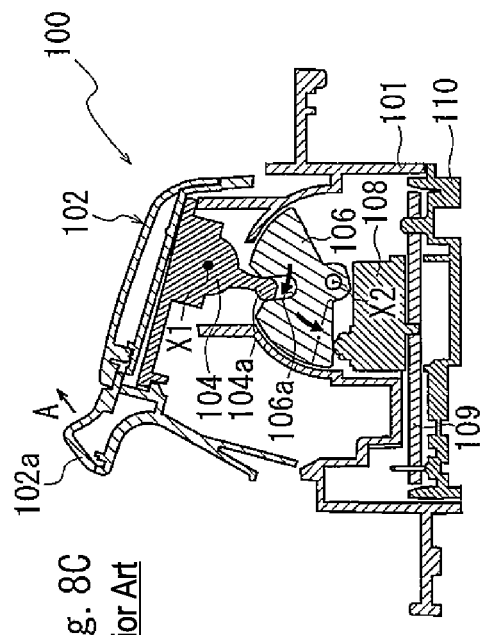

Therefore the light receiving elements 10A, 10B, which are different from the conventional switch, do not require the movable member (cam 105, refer to FIG. 8) for making it possible to output the light receiving signal. Therefore the light receiving elements 10A, 10B are lower in cost and have less defects than the conventional switch element.

In addition, even if two components (light receiving elements) for detecting an on/off operation of a switch are provided for each of the light guiding paths 9A, 9B from a viewpoint of a fail-safe, it does not lead to a large increase of costs.

As described above, the switch 1 according to the present embodiment has the following configuration.

(1) The switch 1 includes the operation detecting portion 7 that detects an operation of the knob 5.

The operation detecting portion 7 includes:
the movable member 6 which displaces in association with the operation of the knob 5;
the through hole 62a which penetrates through the light shielding portion 62 of the movable member 6 in a thickness direction thereof;

one light emitting element (optical source 15) which is provided on one side of the movable member 6 in the thickness direction;
the light guiding path 9A which is provided on the other side of the movable member 6 in the thickness direction; and
the two light receiving elements 10A, 10A which are attached to the light guiding path 9A.

The light guiding path 9A is arranged in a position of being capable of receiving light emitted from the optical source 15 through the through hole 62a when the movable member 6 is arranged in a predetermined position by the operation of the knob 5.

With this configuration, when the movable member 6 is arranged in the predetermined position by the operation of the knob 5, the light emitted from the optical source 15 enters the light guiding path 9A through the through hole 62a, and thereby the light which has entered the light guiding path 9A is received by the light receiving elements 10A, 10A attached to the light guiding path 9A.

Accordingly it is possible to detect that the knob 5 is operated through the reception of the light by the light receiving elements 10A, 10A.

Since a combination of the optical source 15 (light emitting element), the light guiding path 9A and the light receiving elements 10A, 10A can be provided at lower cost than the switch element, it is possible to detect the operation of the knob 5 with a lower priced configuration.

Further, in the above-described embodiment, the light guiding path 9A, which is provided with two light receiving element 10A and 10A in view of a fail-safe, has been explained.

To detect the operation of knob 5, at least one light receiving element 10A should be provided on the light guiding path 9A.

The switch 1 according to the present embodiment has the following configuration.

(2) Two light receiving element 10A, 10A are attached to the light guiding path 9A. Light receiving detecting circuit (reception side electron circuit) which outputs the light receiving signals from the light receiving element 10A, 10A is provide on the printed circuit board 4.

Light receiving detecting circuit outputs the light receiving signals in the case of one light receiving element 10A has received the light, and in the case of the other light receiving element 10A has received the light, respectively.

In a control device to which outputs signals from the light receiving detecting circuit are input, it is judged that knob 5 has operated in the case when it received the light receiving signal from one light receiving element 10A and the light receiving signal from the other light receiving element 10A within a predetermined time (for example, 20 msec).

The switch element 107 (refer to FIG. 8) having mechanical movement is provided with a two-line circuit for detecting an on/off operation of the switch in view of a fail-safe. Therefore the switching element is relatively expensive, and the switch 100 provided with this switching element is higher in cost percent of the switching element in manufacturing costs.

It is possible to save the manufacture cost of the switch when adopting cheaper light receiving element instead of the switch having mechanical movement.

In addition, requirement of a fail-safe can be satisfied by providing two light receiving elements to output the light receiving signals of light receiving element 10A, 10A from the light receiving detection circuit.

The switch 1 according to the present embodiment has the following configuration.

(3) The light guiding path includes the light guiding path 9A (first light guiding path) and the light guiding path 9B (second light guiding path).

The light guiding path 9A and the light guiding path 9B are disposed in parallel (to line) with each other by an interval in a displacement direction of the light shielding portion 62 of the movable member 6.

The light guiding body 8 which disperses light emitted from the optical source 15 (light emitting element) to be guided respectively to the light guiding path 9A and the light guiding path 9B are provided.

The light guiding path 9A is disposed in the position of being capable of receiving the light emitted from the optical source 15 through the through hole 62a when the light shielding portion 62 of the movable member 6 is arranged in the first predetermined position by an operation of the knob 5 in the push direction.

The light guiding path 9B is disposed in the position of being capable of receiving the light emitted from the optical source 15 through the through hole 62a when the light shielding portion 62 of the movable member 6 is arranged in the second predetermined position by the operation of the knob 5 in the pull direction.

With this configuration, it is possible to specify which direction of the push direction and the pull direction the knob 5 is operated to, by confirming which of light receiving elements between light receiving elements 10A, 10A and light receiving elements 10B, 10B have received the light.

Further, it is possible to specify the operating direction of the knob 5 without increasing the number of the optical source 15.

As described above, the switch 1 according to the present embodiment has the following configuration.

(4) There is provided the printed circuit board 4 on which the optical source 15 (light emitting element) and the light receiving elements 10A, 10B are provided.

The light receiving elements 10A, 10B are provided on the upper surface 4a of the printed circuit board 4 in the knob 5-side.

The optical source 15 is arranged in the inside of the accommodation hole 41 provided in the printed circuit board 4.

The light guiding body 8 includes the incident portion 81 of light emitted from the optical source 15.

The light guiding body 8 is provided by inserting the incident portion 81 in the accommodation hole 41 from the knob 5-side.

The incident surface 81a of the incident portion 81 is arranged to face the optical source 15 in the accommodation hole 41.

The optical source 15 is connected electrically to the lower surface 4b of the printed circuit board 4.

With this configuration, the optical source 15 is provided using the thickness of the printed circuit board 4.

Thereby, increasing of the thickness of the switch 1 in the vertical direction of the printed circuit board 4 can be prevented even if the optical source 15 and the light guiding body 8 are provided on the printed circuit board 4.

As described above, the switch 1 according to the present embodiment has the following configuration.

(5) The light guiding body 8 includes the exit portion 83A (first exit portion) which is arranged to face the light guiding path 9A (first light guiding path), and the exit portion 83B (second exit portion) which is arranged to face the light guiding path 9B (second light guiding path).

The light guiding path 9A is supported by the two light receiving elements 10A, 10A which are arranged to have an interval in the thickness direction (direction of the center axis line LA) of the light shielding portion 62.

The light guiding path 9A is arranged to face the exit portion 83A in the position to be spaced in the knob 5-side from the printed circuit board 4 by the two light receiving elements 10A, 10A.

The light guiding path 9B is supported by the two light receiving elements 10B, 10B which are arranged to have an interval in the thickness direction (direction of the center axis line LB) of the light shielding portion 62.

The light guiding path 9B is arranged to face the exit portion 83B in the position to be spaced in the knob 5-side from the printed circuit board 4 by the two light receiving elements 10B, 10B.

With this configuration, the light guiding path 9A and the light guiding path 9B can be securely held in the position of facing the exit portion 83A and the exit portion 83B respectively.

(6) The movable member 6 is provided to be capable of swinging around the rotational shaft X2 in parallel with the rotational shaft X1 of the knob 5.

The movable member 6 is rotated from a reference position (refer to FIG. 1) in one direction determined in response to the operating direction (rotational direction) of the knob 5 by the operable element 55 extending from the knob 5-side.

The through hole 62a provided in the light shielding portion 62 of the movable member 6 displaces in the circumferential direction around the rotational shaft X2 in association with the operation of the knob 5.

With this configuration, the input/non-input of the light emitted from the optical source 15 to the light guiding paths 9A, 9B can be appropriately switched in association with the operation of the knob 5.

In the above-mentioned embodiment, there is exemplified a case where the optical source 15 is arranged in the inside of the accommodation hole 41 provided in the printed circuit board 4. As illustrated in FIG. 3C, the optical source 15 may be provided on the upper surface 4a of the printed circuit board 4.

In this case, a height h' from the upper surface 4a of the printed circuit board 4 to the exit portions 83A, 83B of the light guiding body 8 is greater than a height h in FIG. 3B, but work for providing the accommodation hole 41 in the printed circuit board 4 is not necessary.

In the above-mentioned embodiment, there is exemplified a case where the forward direction of the light emitted from the optical source 15 is changed by the light guiding body 8. As illustrated in FIG. 3D, the light guiding body 8 may be omitted.

In this case, a holder 16 is installed on the upper surface 4a of the printed circuit board 4 to direct the forward direction of the light emitted from the optical source 15 to the light guiding paths 9A, 9B, thereby making it is possible to input the light emitted from the optical source 15 to the light guiding paths 9A, 9B.

In the above-mentioned embodiment, there is exemplified a case where the operation detecting portion 7 configured such that the light guiding paths 9A, 9B are provided in parallel.

In this case, the light that leaked from one among the light guiding paths 9A, 9B may be prevented from entering other light guiding paths 9A, 9B by providing light shielding board 12 (refer to FIG. 3A, virtual line) between the light guiding paths 9A and 9B provided in parallel.

If the light that leaked from one among the light guiding paths 9A, 9B enters other light guiding paths 9A, 9B and the light receiving element 10A, 10B receive the entering light, the operation of the knob 5 may be detected incorrectly. With above-mentioned configuration it is possible to prevent the incorrect detecting of the operation of the knob 5 suitably.

In addition, the processing not to transmit light may be provided on the surface of the light guiding paths 9A, 9B instead of the light shielding board 12. In this case, the leakage of a light from the light guiding paths 9A, 9B can be achieved.

<Modification>

In the above-mentioned embodiment, there is exemplified a case of the operation detecting portion 7 configured such that the light guiding paths 9A, 9B are provided in parallel.

The operation detecting portion 7 is not limited to this form. For example, as illustrated in FIGS. 6A to 6C, there may be adopted an operation detecting portion 7A configured such that the light guiding paths 9A, 9B are serially provided.

Figure 6A:
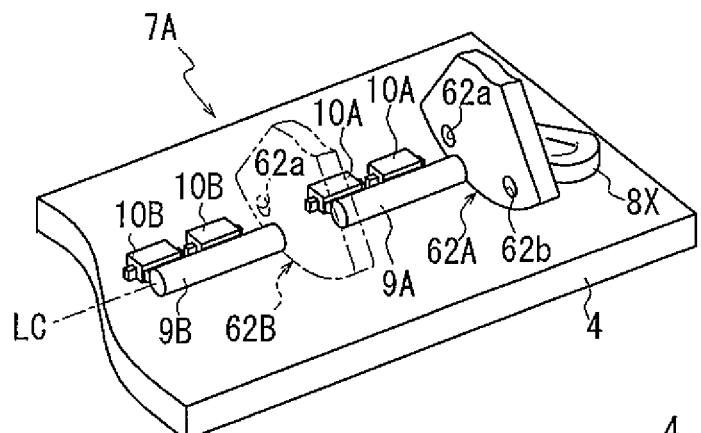
FIGS. 6A to 6C are drawings explaining an operation detecting portion according to a modification.
Figure 6B:
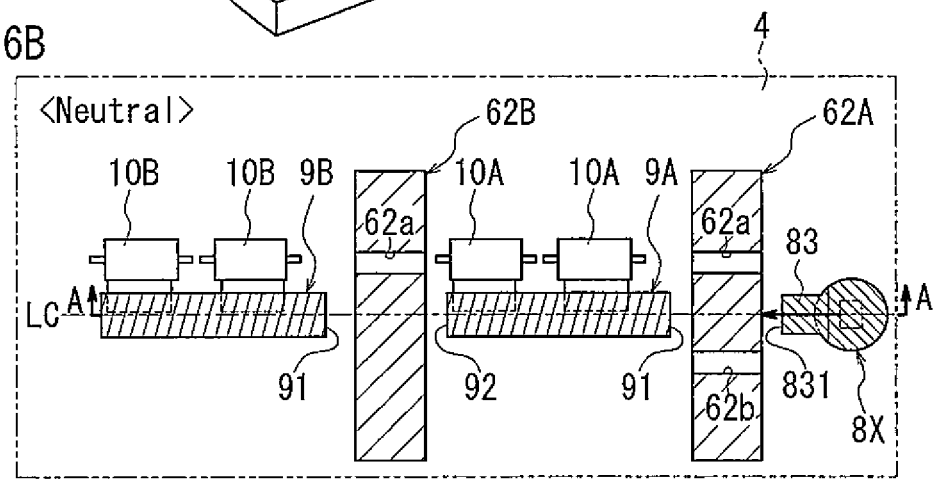
Figure 6C:
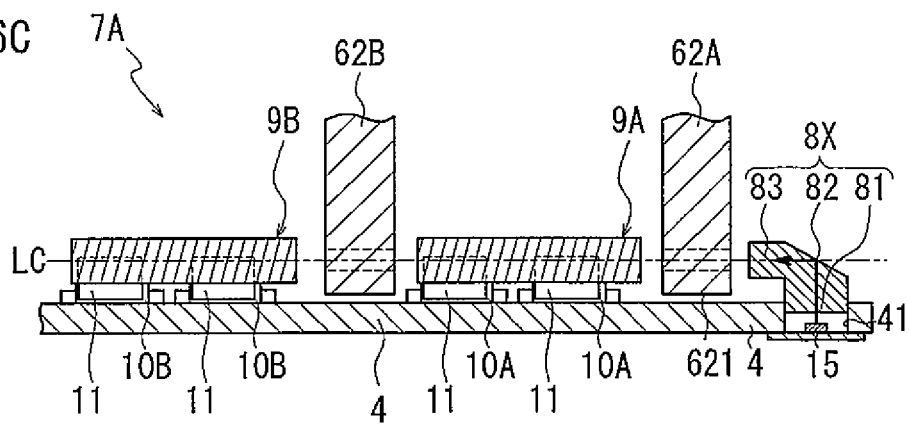

FIGS. 6A to 6C are drawings explaining the configuration of the operation detecting portion 7A according to a modification.

FIG. 6A is an enlarged perspective view illustrating the periphery of the operation detecting portion 7A. FIG. 6B is a drawing illustrating the operation detecting portion 7A as viewed from the knob 5-side, and is a drawing explaining an arrangement of respective components (light guiding body 8X, light shielding portions 62A, 62B, through holes 62a, 62b, light guiding paths 9A, 9B and light receiving elements 10A, 10B) of the operation detecting portion 7A at the time the knob 5 is in a neutral position.

It should be noted that in FIG. 6B, the light guiding body 8X, the light shielding portions 62A, 62B and the light guiding paths 9A, 9B are illustrated by a cross-sectional surface by cutting them in a height position of the through holes 62a, 62b on a basis of the printed circuit board 4.

FIG. 6C is a cross section by cutting the operation detecting portion 7A along line A-A in FIG. 6B.

The operation detecting portion 7A includes the light guiding body 8X to which the light emitted from the optical source 15 is incident, the light guiding paths 9A, 9B, the light receiving elements 10A, 10A, 10B, 10B attached to the light guiding paths 9A, 9B and the pair of light shielding portions 62A, 62B.

The light guiding paths 9A, 9B each is a member which is formed in a columnar shape and with a material in light transmission properties. The light guiding paths 9A, 9B are serially arranged on the center axis line LC to be spaced from each other.

The light guiding body 8X is formed with a material in light transmitting properties, and changes a moving direction of the light emitted from the optical source 15.

In the light guiding body 8X, the exit portion 83 is provided in a direction along the center axis line LC, and in the present embodiment, the light guiding body 8X changes the moving direction of light to a direction along the center axis line LC and toward the light guiding path 9A.

The exit surface 831 of the exit portion 83 is a flat surface perpendicular to the center axis line LC, and the exit surface 831 faces the incident surface 91 of the light guiding path 9A to have an interval thereto.

The light shielding portion 62A of the movable member 6 is positioned between the exit portion 83 and the light guiding path 9A. Further, the light shielding portion 62B of the movable member 6 is positioned between the exit surface 92 of the light guiding path 9A and the incident surface 91 of the light guiding path 9B. The light shielding portions 62A, 62B are respectively formed to be integral with the above-mentioned movable members 6, 6. The movable members 6, 6 are supported to be capable of swinging by the case 2, and the light shielding portions 62A, 62B displace in the circumferential direction around the rotational shaft X2 in association with an operation of the knob 5. At this time, the light shielding portions 62A, 62B each displace in the same direction as the circumferential direction around the rotational shaft X2 by the same displacement amount. That is, the light shielding portions 62A, 62B displace integrally in the circumferential direction around the rotational shaft X2 in association with an operation of the knob 5.

As illustrated in FIG. 6B, in the operation detecting portion 7A, the light guiding body 8X, the light shielding portion 62A, the light guiding path 9A, the light shielding portion 62B and the light guiding path 9B serially line up on the center axis line LC of the light guiding paths 9A, 9B.

The light shielding portion 62A is provided with the two through holes 62a, 62b.

In the light shielding portion 62A, the through hole 62a is provided in a position of being arranged on the center axis line LC when the knob 5 is operated to a predetermined position (second predetermined position) in the pull side.

In the light shielding portion 62A, the through hole 62b is provided in a position of being arranged on the center axis line LC when the knob 5 is operated to a predetermined position (first predetermined position) in the push side.

Further, the two through holes 62a, 62b are set to be positioned to meet the following relation.

(a) When the knob 5 is arranged in a neutral position, a substantially intermediate position between the through hole 62a and the through hole 62b is arranged on the center axis line LC.

(b) In a state where the substantially intermediate position between the through hole 62a and the through hole 62b is arranged on the center axis line LC, the through hole 62a and the through hole 62b are arranged to be symmetric about the center axis line LC.

The light shielding portion 62B is provided with the one through hole 62a.

In the light shielding portion 62B, the through hole 62a is provided in a position of being arranged on the center axis line LC when the knob 5 is operated to a predetermined position (second predetermined position) in the pull side.

Figure 7A:
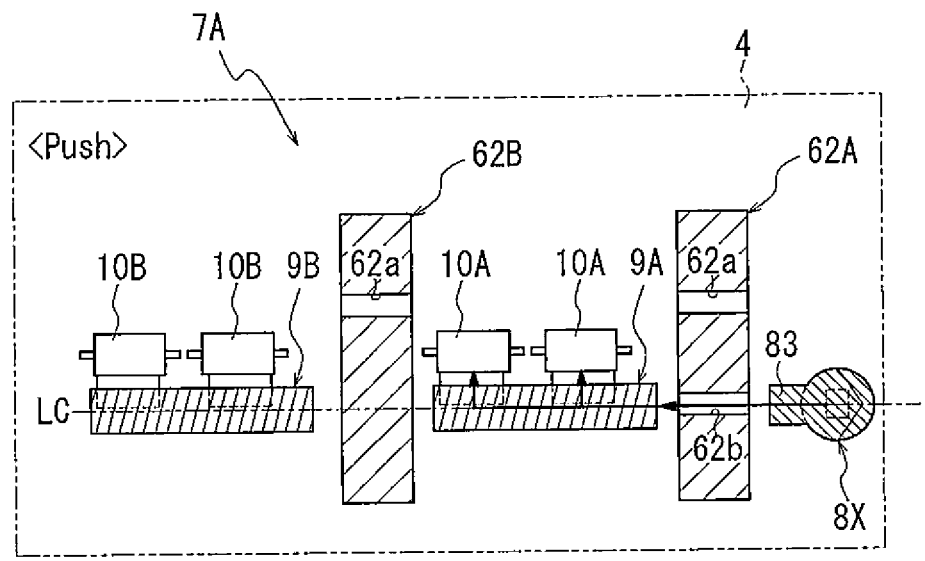
FIGS. 7A and 7B are drawings explaining an operation of the operation detecting portion in association with an operation of a knob according to the modification.
Figure 7B:
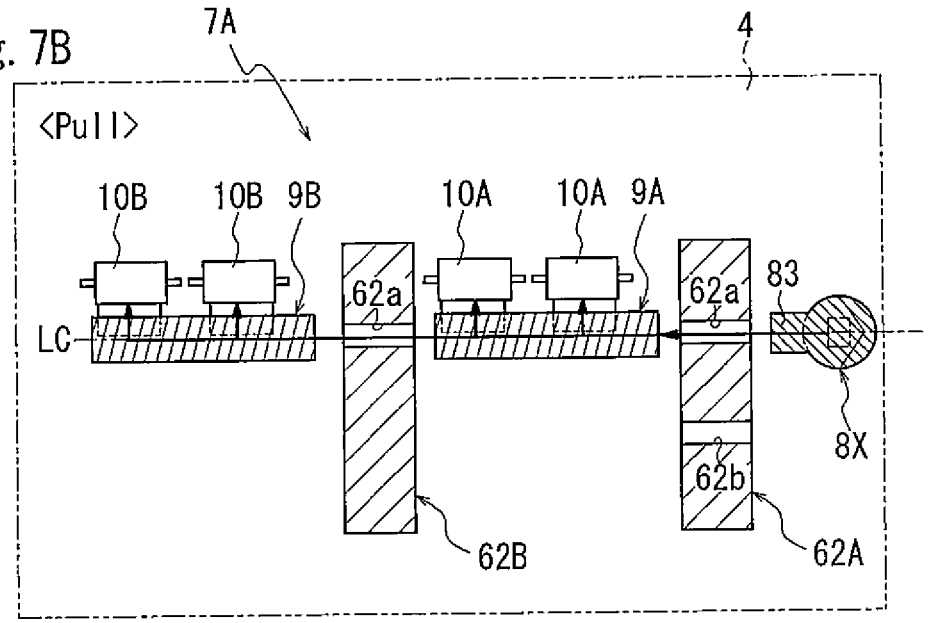

FIG. 7A and FIG. 7B are drawings explaining an operation of the operation detecting portion 7A in association with an operation of the knob 5.

FIG. 7A is a drawing explaining a relation between an arrangement of the light shielding portions 62A, 62B and the center axis line LC in a case where the knob 5 is operated in the push side. FIG. 7B is a drawing explaining a relation between an arrangement of the light shielding portions 62A, 62B and the center axis line LC in a case where the knob 5 is operated to the pull side.

In a state where an operating force by a user is not acting on the knob 5 of the switch 1, the knob 5 is arranged in the neutral position by an urging force of an unillustrated spring.

In a state where the knob 5 is arranged in the neutral position, the through holes 62a, 62b of the light shielding portions 62A and the through hole 62a of the light shielding portions 62B are arranged to be a position out of the center axis line LC (refer to FIG. 6B and FIG. 6C).

Therefore the light emitted from the exit portion 83 after being incident to the light guiding body 8X from the optical source 15 is blocked from being incident to the light guiding path 9A by the light shielding portion 62A.

Therefore the light receiving signal is not outputted from any of the light receiving elements 10A, 10A, 10B, 10B, either.

When the knob 5 is operated to the push side, the light shielding portions 62A, 62B displace to an upper side in FIG. 6B.

Then, the displacement of the knob 5 to a predetermined position in the push side terminates when the attaching plate 53 (refer to FIG. 1) of the knob 5 abuts on the upper end 22b (stopper) of the support wall 22. That is, the displacement of the knob 5 terminates when the knob 5 reaching the first predetermined position. In this state, the through hole 62b of the light shielding portion 62A is arranged in a position of overlapping the center axis line LC of the light guiding path 9A between the exit portion 83 and the light guiding path 9A (refer to FIG. 7A).

In this state, the exit portion 83, the through hole 62b of the light shielding portion 62A and the light guiding path 9A are arranged on the common center axis line LC. Therefore the light outputted from the exit portion 83 from among lights which are outputted from the optical source 15 and enter the light guiding body 8 enters the light guiding path 9A through the through hole 62b.

In addition, the light incident to the light guiding path 9A is received respectively in the light receiving elements 10A, 10A attached to the light guiding path 9A, and light receiving signals thereof are outputted from the light receiving elements 10A, 10A.

In this state, a region where the through hole 62a is not provided of the other light shielding portion 62B is positioned on the center axis line LC. Therefore the light outputted from the exit surface 92 from among lights which are incident to the incident surface 91 of the light guiding path 9A is blocked by the light shielding portion 62B and cannot enter the light guiding path 9B.

Therefore light receiving signals are not outputted from the light receiving elements 10B, 10B attached to the light guiding path 9B.

Accordingly in the control device (unillustrated) to which output signals of the switch 1 are input, it is possible to detect the operation of the knob 5 to the push side when input of light receiving signals from the light receiving elements 10A, 10A only.

On the other hand, when the knob 5 is operated to the pull side, the light shielding portions 62A, 62B displace to a lower side in FIG. 6B.

Then, the displacement of the knob 5 terminates when the knob 5 abuts on the upper end 22a (stopper) of the support wall 22. That is, the displacement of the knob 5 terminates when the knob 5 reaching the second predetermined position. In this state, the through hole 62b of the light shielding portion 62A is arranged in a position of overlapping the center axis line LC of the light guiding path 9A between the exit portion 83 and the light guiding path 9A (refer to FIG. 7B). Further, the through hole 62a of the light shielding portion 62B is arranged in a position of overlapping the center axis line LC of the light guiding paths 9A, 9B between the light guiding path 9A and the light guiding path 9B (refer to FIG. 7B).

In this state, the light outputted from the exit portion 83 from among lights which are outputted from the optical source 15 and enter the light guiding body 8X enters the light guiding path 9A through the through hole 62a of the light shielding portion 62A.

In addition, the light incident to the light guiding path 9A is received respectively in the light receiving elements 10A, 10A attached to the light guiding path 9A, and light receiving signals thereof are outputted from the light receiving elements 10A, 10A.

Further, the light outputted from the exit surface 92 of the light guiding path 9A from among lights which are incident to the light guiding path 9A enters the light guiding path 9B through the through hole 62a of the light shielding portion 62B.

In addition, the light incident to the light guiding path 9B is received respectively in the light receiving elements 10B, 10B attached to the light guiding path 9B, and light receiving signals thereof are outputted from the light receiving elements 10B, 10B.

Accordingly in the control device (unillustrated) to which output signals of the switch 1 are input, it is possible to detect the operation of the knob 5 to the pull side when input of light receiving signals from both the light receiving elements 10A, 10A and the light receiving elements 10B, 10B.

<Claim 5>

The switch 1 according to the modification has the following configuration.

(7) The switch 1 includes the operation detecting portion 7A which detects an operation of the knob 5.

The light guiding path includes the light guiding path 9A (first light guiding path) and the light guiding path 9B (second light guiding path).

The light guiding path 9A and the light guiding path 9B are provided coaxially on the center axis line LC, and are serially provided to have an interval in the direction of the center axis line LC.

The movable member includes the movable member 6 (first movable member) with the light shielding portion 62A and the movable member 6 (second movable member) with the light shielding portion 62B.

The light shielding portion 62A of the movable member 6 is positioned in the incident surface 91-side of the light guiding path 9A.

The light shielding portion 62B of the movable member 6 is positioned in the exit surface 92-side of the light guiding path 9A.

The light shielding portion 62A of the movable member 6 is provided with the two through holes 62a, 62b.

The one through hole 62b of the two through holes 62a, 62b in the light shielding portion 62A is provided in a position intersecting with the center axis line LC of the light guiding path 9A when the light shielding portion 62A of the movable member 6 is arranged in a first predetermined position by the operation of the knob 5.

The other through hole 62a of the two through holes 62a, 62b in the light shielding portion 62A is provided in the position intersecting with the center axis line LC of the light guiding path 9A when the light shielding portion 62A of the movable member 6 is arranged in a second predetermined position by the operation of the knob 5.

The light shielding portion 62B of the movable member 6 is provided with the one through hole 62a.

The through hole 62a of the light shielding portion 62B is provided in a position intersecting with the center axis line LC of the light guiding path 9A when the light shielding portion 62B of the movable member 6 is arranged in a second predetermined position by the operation of the knob 5.

With this configuration, by confirming whether the light is received by only the light receiving elements 10A, 10A attached to the light guiding path 9A or by both of the light receiving elements 10A, 10A and the light receiving elements 10B, 10B, it is possible to specify which direction of the push direction and the pull direction the knob 5 is operated to.

Since it is possible to provide the operation detecting portion 7A by a combination of the optical source 15 (light emitting element), the light guiding paths 9A, 9B, the light receiving elements 10A, 10A, 10B, 10B and the light shielding portions 62A, 62B at lower cost than the switching element, it is possible to detect the operation of the knob 5 with the lower priced configuration.

In the above-mentioned embodiment and the modification, there is exemplified a switch 1 having the following configuration.

(a) Knob 5 which is operating by the user is provided to be capable of swinging around the rotational shaft X1 in the case 2.

(b) The light shielding portion 62 of the movable member 6 displace in the circumferential direction around the rotational shaft X1 in association with an operation of the knob 5.

The present invention is not limited only to the switch of this form.

For example, it is applicable to a slide switch in which movable member moves reciprocatory in the axis line direction in association with an operation of the knob.

As described above, the embodiment and the modification in the present invention are explained, but the present invention is not limited to the above embodiment and modification, and can be modified as needed within the scope of the technical concept of the invention.

What is claimed is:

1. A switch comprising:
a printed circuit board;
a movable member displaceable in association with an operation of a knob, the movable member including a through hole penetrating therethrough in a thickness direction of the movable member;
a light emitting element arranged on one side of the movable member in the thickness direction;
a plurality of light guiding paths arranged on the other side of the movable member in the thickness direction such that at least one of the plurality of light guiding paths receives at least a portion of the light emitted from the light emitting element passing through the through hole when the movable member is arranged in a predetermined position via the operation of the knob; and
a plurality of receiving elements arranged on a knob-side surface of the printed circuit board and coupling the plurality of light guiding paths to the printed circuit board.

2. The switch according to claim 1, further comprising a receiver electronics circuit operatively coupled to the plurality of receiving elements, wherein:
each light guiding path of the plurality of light guiding paths is coupled to at least two respective receiving elements of the plurality of receiving elements, the at least two respective receiving elements arranged one after the other in a longitudinal direction of the light guiding path; and
the receiver electronics circuit is configured to output a signal emulating an output signal of a mechanical switch element when both of the at least two respective receiving elements receive the light from the light emitting element via the light guiding path.

3. The switch according to claim 1, wherein:
the plurality of light guiding paths are arranged in series and spaced apart from one another in the thickness direction;
the movable member includes a first movable member and a second movable member disposed on opposite sides of a first light guiding path of the plurality of light guiding paths relative to the thickness direction, the first movable member including two first moveable member through holes and the second movable member including the through hole;
when the movable member is arranged in a first predetermined position via the operation of the knob, a center axis line of the first light guiding path intersects the one of the two first moveable member through holes; and
when the movable member is arranged in a second predetermined position via the operation of the knob, the center axis line of the first light guiding path intersects the other of the two first moveable member through holes and the through hole of the second movable member.

4. The switch according to claim 1, further comprising a light guiding body, wherein:
the plurality of light guiding paths are disposed parallel with each other and spaced apart from one another in a displacement direction of the movable member;
the light guiding body is structured to disperse and guide the light emitted from the light emitting element to each of the plurality of light guiding paths;
a first light guiding path of the plurality of light guiding paths is arranged such that the first light guiding path receives the light emitted from the light emitting element passing through the through hole when the movable member is arranged in a first predetermined position via the operation of the knob; and
a second light guiding path of the plurality of light guiding paths is arranged such that the second light guiding path receives the light emitted from the light emitting element passing through the through hole when the movable member is arranged in a second predetermined position via the operation of the knob.

5. The switch according to claim 4, further comprising a light separator separating optically the first light guiding path and the second light guiding path.

6. The switch according to claim 4, wherein:
the light emitting element is arranged in an accommodation hole disposed in the knob-side surface of the printed circuit board; and
the light guiding body includes an incident portion protruding into and arranged at least partially in the accommodation hole.

7. The switch according to claim 6, wherein:
the light guiding body further includes a first exit portion arranged to face the first light guiding path and a second exit portion arranged to face the second light guiding path;
the plurality of receiving elements couple the plurality of light guiding paths to the printed circuit board such that the plurality of light guiding paths are disposed spaced apart from the knob-side surface of the printed circuit board;
the first light guiding path is arranged facing the first exit portion; and
the second light guiding path is arranged facing the second exit portion.

8. A switch comprising:
a movable member displaceable in association with an operation of a knob;

a through hole which penetrates through the movable member in a thickness direction of the movable member;
one light emitting element arranged on one side of the movable member in the thickness direction;
at least one light guiding path arranged on an other side of the movable member in the thickness direction;
at least one receiving element attached to the at least one light guiding path;
a receiver electronics circuit;
wherein the at least one light guiding path is arranged such that the at least one light guiding path receives a light emitted from the light emitting element passing through the through hole when the movable member is arranged in a predetermined position via the operation of the knob;
wherein the at least one receiving element includes a pair of receiving elements attached to the at least one light guiding path in a longitudinal direction of the at least one light guiding path such that both receiving elements of the pair of receiving elements receive the light emitted from the light emitting element through the through hole when the movable member is arranged in the predetermined position; and
wherein the receiver electronics circuit is configured to output a signal emulating an output signal of a mechanical switch element when both receiving elements of the pair of receiving elements receive the light from the light emitting element.

9. The switch according to claim 8, wherein:
the movable member is swingable around a rotational shaft that extends parallel to a rotational shaft of the knob; and
the movable member is rotatable from a reference position in one direction, determined in response to a rotational direction of the knob, via an operable element extending from the knob.

10. The switch according to claim 8, further comprising a printed circuit board, wherein the pair of receiving elements are arranged on a knob-side surface of the printed circuit board and couple the at least one light guiding path to the printed circuit board such that the at least one light guiding path is disposed spaced apart from the knob-side surface of the printed circuit board.

11. The switch according to claim 8, wherein the at least one light guiding path has a columnar shape and includes a material facilitating transmission of light.

12. The switch according to claim 8, further comprising a plurality of support members through which light is transmittable, wherein each receiving element of the pair of receiving elements is coupled to the at least one light guiding path via a respective support member of the plurality of support members.

13. The switch according to claim 8, wherein:
the at least one light guiding path includes a first light guiding path and a second light guiding path, the first light guiding path and the second light guiding path arranged in series to have an interval therebetween;
the movable member includes a first movable member and a second movable member, the first movable member arranged in an incident side of the first light guiding path and the second movable member arranged in an exit side of the first light guiding path;
the first movable member includes two first moveable member through holes;
one of the two first moveable member through holes is arranged such that a center axis line of the first light guiding path intersects the one of the two first moveable member through holes when the movable member is arranged in a first predetermined position via the operation of the knob;
the other of the two first moveable member through holes is arranged such that the center axis line of the first light guiding path intersects the other of the two first moveable member through holes when the movable member is arranged in a second predetermined position via the operation of the knob;
the second movable member includes the through hole; and
the through hole of the second movable member is arranged such that the center axis line of the first light guiding path intersects the through hole when the movable member is arranged in the second predetermined position via the operation of the knob.

14. The switch according to claim 13, further comprising a light guiding body and a printed circuit board, wherein:
the light guiding body is structured to disperse and guide the light emitted from the light emitting element to the first light guiding path and the second light guiding path;
the pair of receiving elements are arranged on a surface of the printed circuit board on a knob side;
the light emitting element is arranged completely within an accommodation hole disposed in the printed circuit board; and
the light guiding body includes an incident portion inserted into and arranged in the accommodation hole from the knob side.

15. The switch according to claim 8, further comprising a light guiding body, wherein:
the at least one light guiding path includes a first light guiding path and a second light guiding path, the first light guiding path and the second light guiding path disposed parallel with each other to have an interval therebetween in a displacement direction of the movable member;
the light guiding body is structured to disperse the light emitted from the light emitting element to be guided respectively to the first light guiding path and the second light guiding path;
the first light guiding path is disposed in a position such that the first light guiding path receives the light emitted from the light emitting element passing through the through hole when the movable member is arranged in a first predetermined position via the operation of the knob; and
the second light guiding path is disposed in a position such that the second light guiding path receives the light emitted from the light emitting element passing through the through hole when the movable member is arranged in a second predetermined position via the operation of the knob.

16. The switch according to claim 15, further comprising a light separator separating optically the first light guiding path and the second light guiding path.

17. The switch according to claim 15, wherein:
the movable member is swingable around a rotational shaft that extends parallel to a rotational shaft of the knob; and
the movable member is rotatable from a reference position in one direction, determined in response to a rotational direction of the knob, via an operable element extending from the knob.

18. The switch according to claim 15, further comprising a printed circuit board, wherein:
the pair of receiving elements are arranged on a surface of the printed circuit board on a knob side;
the light emitting element is arranged in an accommodation hole disposed in the printed circuit board;
the light guiding body includes an incident portion; and
the incident portion is inserted into and arranged in the accommodation hole from the knob side.

19. The switch according to claim 18, wherein:
the light guiding body further includes a first exit portion arranged to face the first light guiding path and a second exit portion arranged to face the second light guiding path;
the first light guiding path is supported by the pair of light receiving elements which are arranged to have an interval therebetween in the thickness direction;
the first light guiding path is arranged facing the first exit portion in a position spaced, on the knob side, from the printed circuit board by the pair of light receiving elements;
the second light guiding path is supported by the pair of light receiving elements which are arranged to have an interval in the thickness direction; and
the second light guiding path is arranged facing the second exit portion in a position spaced, on the knob side, from the printed circuit board by the pair of light receiving elements.

20. A switch comprising:
a movable member displaceable in association with an operation of a knob;
a through hole which penetrates through the movable member in a thickness direction of the movable member;
one light emitting element arranged on one side of the movable member in the thickness direction;
at least one light guiding path arranged on an other side of the movable member in the thickness direction;
at least one light receiving element attached to the at least one light guiding path;
wherein the at least one light guiding path is arranged such that the at least one light guiding path receives a light emitted from the light emitting element passing through the through hole when the movable member is arranged in a predetermined position via the operation of the knob;
wherein the at least one light guiding path includes a first light guiding path and a second light guiding path, the first light guiding path and the second light guiding path arranged in series to have an interval therebetween;
wherein the movable member includes a first movable member and a second movable member, the first movable member arranged in an incident side of the first light guiding path and the second movable member arranged in an exit side of the first light guiding path;
wherein the first movable member includes two first moveable member through holes;
wherein one of the two first moveable member through holes is arranged such that a center axis line of the first light guiding path intersects the one of the two first moveable member through holes when the movable member is arranged in a first predetermined position via the operation of the knob;
wherein the other of the two first moveable member through holes is arranged such that the center axis line of the first light guiding path intersects the other of the two first moveable member through holes when the movable member is arranged in a second predetermined position via the operation of the knob;
wherein the second movable member includes the through hole; and
wherein the through hole of the second movable member is arranged such that the center axis line of the first light guiding path intersects the through hole when the movable member is arranged in the second predetermined position via the operation of the knob.

* * * * *